(12) United States Patent
Lee et al.

(10) Patent No.: US 11,843,365 B2
(45) Date of Patent: Dec. 12, 2023

(54) BULK-ACOUSTIC WAVE RESONATOR

(71) Applicant: SAMSUNG ELECTRO-MECHANICS CO., LTD., Suwon-si (KR)

(72) Inventors: Tae Kyung Lee, Suwon-si (KR); Won Han, Suwon-si (KR); Moon Chul Lee, Suwon-si (KR); Sang Uk Son, Suwon-si (KR); Hwa Sun Lee, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 414 days.

(21) Appl. No.: 17/144,602

(22) Filed: Jan. 8, 2021

(65) Prior Publication Data
US 2022/0038075 A1 Feb. 3, 2022

(30) Foreign Application Priority Data
Jul. 28, 2020 (KR) .......................... 10-2020-0093989

(51) Int. Cl.
*H03H 9/17* (2006.01)
*H03H 9/02* (2006.01)

(52) U.S. Cl.
CPC ........ *H03H 9/173* (2013.01); *H03H 9/02118* (2013.01)

(58) Field of Classification Search
CPC ..................... H03H 9/173; H03H 9/02118
See application file for complete search history.

(56) References Cited

U.S. PATENT DOCUMENTS

| 10,432,166 | B2 | 10/2019 | Liu et al. | |
| 2017/0366157 | A1* | 12/2017 | Liu | H03H 3/04 |
| 2018/0013397 | A1* | 1/2018 | Lim | H03H 3/02 |
| 2018/0048281 | A1* | 2/2018 | Lee | H03H 9/02102 |

(Continued)

FOREIGN PATENT DOCUMENTS

| CN | 111313857 A | 6/2020 |
| JP | 2017-225042 A | 12/2017 |

(Continued)

OTHER PUBLICATIONS

English Translation of CN 111313857 (Year: 2020).*

(Continued)

*Primary Examiner* — Bryan P Gordon
(74) *Attorney, Agent, or Firm* — NSIP Law

(57) ABSTRACT

A bulk-acoustic wave resonator includes a resonator including a central portion in which a first electrode, a piezoelectric layer, and a second electrode are sequentially stacked on a substrate, and an extension portion disposed along a periphery of the central portion; and an insertion layer disposed between the piezoelectric layer and the substrate in the extension portion to raise the piezoelectric layer. The insertion layer includes a first insertion layer having a first inclined surface formed along a side surface facing the central portion and a second inclined surface disposed between the first insertion layer and the piezoelectric layer and having a second inclined surface spaced apart from the first inclined surface with respect to a surface direction of the first electrode. The first insertion layer is thinner than the second insertion layer.

16 Claims, 8 Drawing Sheets

(56) References Cited

U.S. PATENT DOCUMENTS

2018/0219528 A1* 8/2018 Liu .................. H03H 9/131
2020/0195220 A1* 6/2020 Han .................. H03H 9/02118

FOREIGN PATENT DOCUMENTS

| JP | 6556099 B2 | 12/2017 |
| JP | 6556173 B2 | 8/2019 |
| KR | 10-2020-0073955 A | 6/2020 |

OTHER PUBLICATIONS

Korean Office Action dated Feb. 25, 2022, in counterpart Korean Patent Application No. 10-2020-0093989 (10 pages in English and 6 pages in Korean).

* cited by examiner

| DIVISION COMPARATIVE EXAMPLE | WIDTH OF FIRST INSERTION LAYER [um] | THICKNESS OF FIRST INSERTION LAYER [um] | WIDTH OF FIRST INSERTION LAYER/ THICKNESS OF FIRST INSERTION LAYER | $K_t^2$ [%] | REFLECTIVE CHARACTERISTICS [dB] | $K_t^2$ x REFLECTIVE CHARACTERISTICS |
|---|---|---|---|---|---|---|
| 0 | | | | 8.3 | 33.1 | 274.7 |
| 1 | 1.3 | 0.25 | 5.2 | 7.7 | 36.1 | 279.3 |
| 2 | 0.6 | 0.1 | 6 | 8.0 | 37.6 | 300.8 |
| 3 | 0.8 | 0.1 | 8 | 7.9 | 38.9 | 308.9 |
| 4 | 1 | 0.1 | 10 | 7.9 | 37.7 | 297.1 |

BULK-ACOUSTIC WAVE RESONATOR

CROSS-REFERENCE TO RELATED APPLICATION(S)

This application claims the benefit under 35 USC 119(a) of Korean Patent Application No. 10-2020-0093989 filed on Jul. 28, 2020 in the Korean Intellectual Property Office, the entire disclosure of which is incorporated herein by reference for all purposes.

BACKGROUND

1. Field

The following description relates to a bulk-acoustic wave resonator.

2. Description of Related Art

In accordance with the trend for the miniaturization of wireless communication devices, the miniaturization of high frequency component technology has been actively demanded. For example, a bulk-acoustic wave (BAW) type filter using semiconductor thin film wafer manufacturing technology may be used.

A bulk-acoustic resonator (BAW) is formed when a thin film type element, causing resonance by depositing a piezoelectric dielectric material on a silicon wafer, a semiconductor substrate, and using the piezoelectric characteristics thereof, is implemented as a filter.

Technological interest in 5G communication is increasing, and the development of technologies that can be implemented in candidate bands is being actively performed.

However, in the case of 5G communications using a Sub 6 GHz (4 to 6 GHz) frequency band, since the bandwidth is increased and the communication distance is shortened, the strength or power of the signal of the bulk-acoustic wave resonator may be increased. In addition, as the frequency increases, losses occurring in the piezoelectric layer or the resonator may be increased.

Therefore, a bulk-acoustic wave resonator capable of minimizing the energy leakage from the resonator is required.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

A bulk-acoustic wave resonator capable of minimizing energy leakage and a method for manufacturing the same.

In one general aspect, a bulk-acoustic wave resonator includes: a resonator including a central portion in which a first electrode, a piezoelectric layer, and a second electrode are sequentially stacked on a substrate, and an extension portion disposed along a periphery of the central portion; and an insertion layer disposed between the piezoelectric layer and the substrate in the extension portion to raise the piezoelectric layer, wherein the insertion layer includes a first insertion layer having a first inclined surface formed along a side surface facing the central portion, and a second insertion layer disposed between the first insertion layer and the piezoelectric layer and having a second inclined surface spaced apart from the first inclined surface with respect to a surface direction of the first electrode, wherein the first insertion layer is thinner than the second insertion layer.

The bulk-acoustic wave resonator may satisfy width of the first insertion layer/thickness of the first insertion layer >6, where the width of the first insertion layer is a distance between a terminal end of the first inclined surface of the first insertion layer and a terminal end of the second inclined surface of the second insertion layer.

The first inclined surface and the second inclined surface may have different angles of inclination.

An angle of inclination of the second inclined surface may be narrower than an angle of inclination of the first inclined surface.

An angle of inclination of the first inclined surface may be within a range of 30° or higher to 70° or lower, and an angle of inclination of the second inclined surface may be within a range of 5° or higher to 70° or lower.

The second insertion layer may have a thickness of 2000 Å or more, and the first insertion layer may have a thickness of 2000 Å or less.

The first insertion layer may be formed of a material having a larger acoustic impedance than an acoustic impedance of the second insertion layer.

The first insertion layer may be formed of silicon oxide ($SiO_2$).

The second insertion layer may be formed of any one of alumina ($Al_2O_3$), aluminum nitride (AlN), silicon carbide (SiC), and silicon nitride ($Si_3N_4$).

The piezoelectric layer may include a first inclined portion defined by the first inclined surface and a second inclined portion defined by the second inclined surface, and the first inclined portion and the second inclined portion may be spaced apart with respect to the surface direction of the first electrode.

An end of the second electrode may be disposed on the second inclined portion.

The first insertion layer may be disposed between the first electrode and the substrate, and at least a portion of the second insertion layer may be disposed between the first electrode and the piezoelectric layer.

In another general aspect, a bulk-acoustic wave resonator includes: a resonator including a central portion in which a first electrode, a piezoelectric layer and a second electrode are sequentially stacked on a substrate, and an extension portion disposed along a periphery of the central portion; and an insertion layer disposed between the piezoelectric layer and the substrate in the extension portion to raise the piezoelectric layer, wherein the insertion layer includes a first insertion layer having a first inclined surface formed along a side surface facing the central portion and a second insertion layer disposed between the first insertion layer and the piezoelectric layer and having a second inclined surface spaced apart from the first inclined surface with respect to a surface direction of the first electrode, and an angle of inclination of the second inclined surface is narrower than an angle of inclination of the first inclined surface.

The angle of inclination of the first inclined surface may be within a range of 30° or higher to 70° or lower, and the angle of inclination of the second inclined surface may be within a range of 5° or higher to 40° or lower.

The second inclined surface may have a wider area than the first inclined surface.

The first insertion layer and second insertion layer may have different thicknesses.

Other features and aspects will be apparent from the following detailed description, the drawings, and the claims.

BRIEF DESCRIPTION OF DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
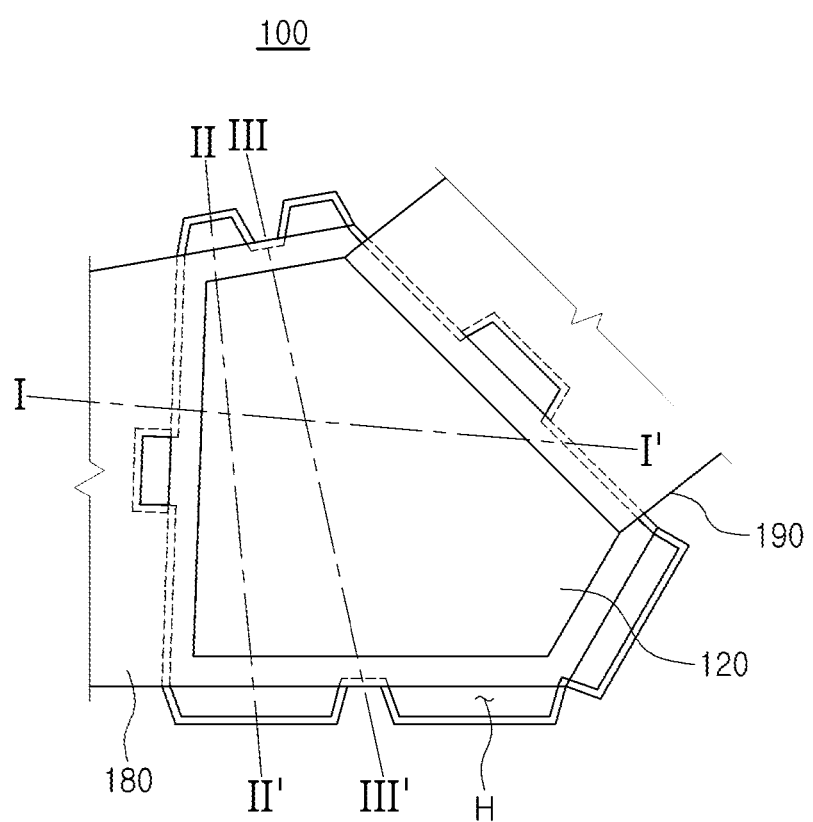
FIG. 1 is a plan view of a bulk-acoustic wave resonator according to an example.

The following detailed description is provided to assist the reader in gaining a comprehensive understanding of the methods, apparatuses, and/or systems described herein. However, various changes, modifications, and equivalents of the methods, apparatuses, and/or systems described herein will be apparent to one of ordinary skill in the art. The sequences of operations described herein are merely examples, and are not limited to those set forth herein, but may be changed as will be apparent to one of ordinary skill in the art, with the exception of operations necessarily occurring in a certain order. Also, descriptions of functions and constructions that would be well known to one of ordinary skill in the art may be omitted for increased clarity and conciseness.

The features described herein may be embodied in different forms, and are not to be construed as being limited to the examples described herein. Rather, the examples described herein have been provided so that this disclosure will be thorough and complete, and will fully convey the scope of the disclosure to one of ordinary skill in the art.

Herein, it is noted that use of the term "may" with respect to an example or embodiment, e.g., as to what an example or embodiment may include or implement, means that at least one example or embodiment exists in which such a feature is included or implemented while all examples and embodiments are not limited thereto.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include changes in shape that occur during manufacturing.

The features of the examples described herein may be combined in various ways as will be apparent after an understanding of the disclosure of this application. Further, although the examples described herein have a variety of configurations, other configurations are possible as will be apparent after an understanding of the disclosure of this application.

Figure 2:
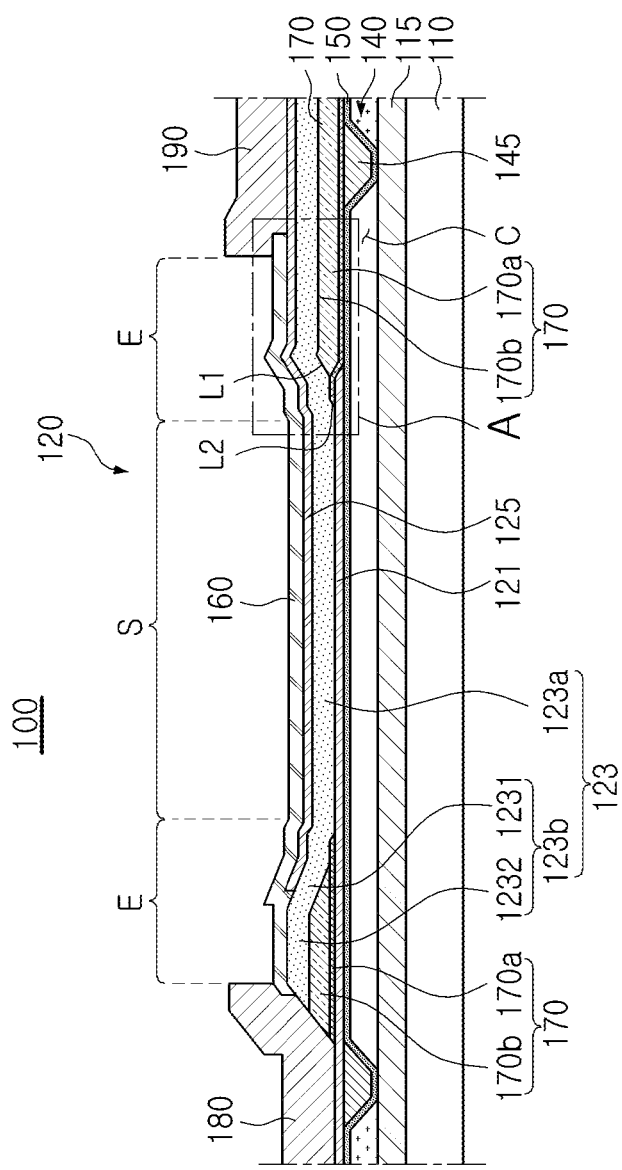
FIG. 2 is a cross-sectional view taken along line I-I' of FIG. 1.
Figure 3:
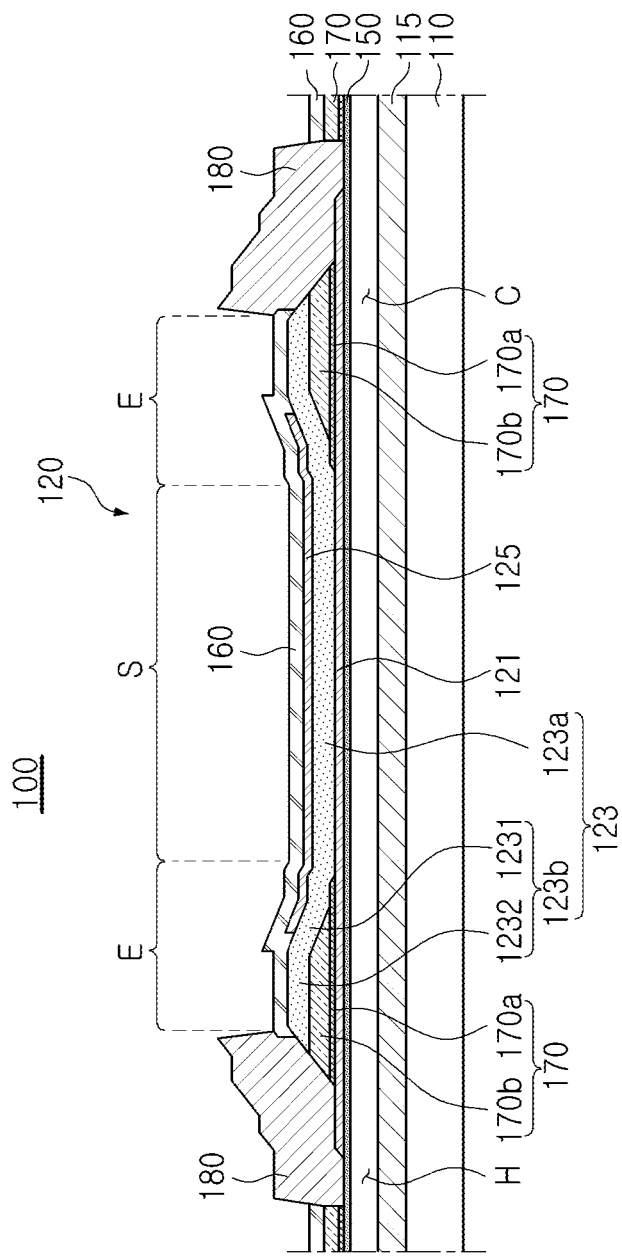
FIG. 3 is a cross-sectional view taken along line II-II' of FIG. 1.
Figure 4:
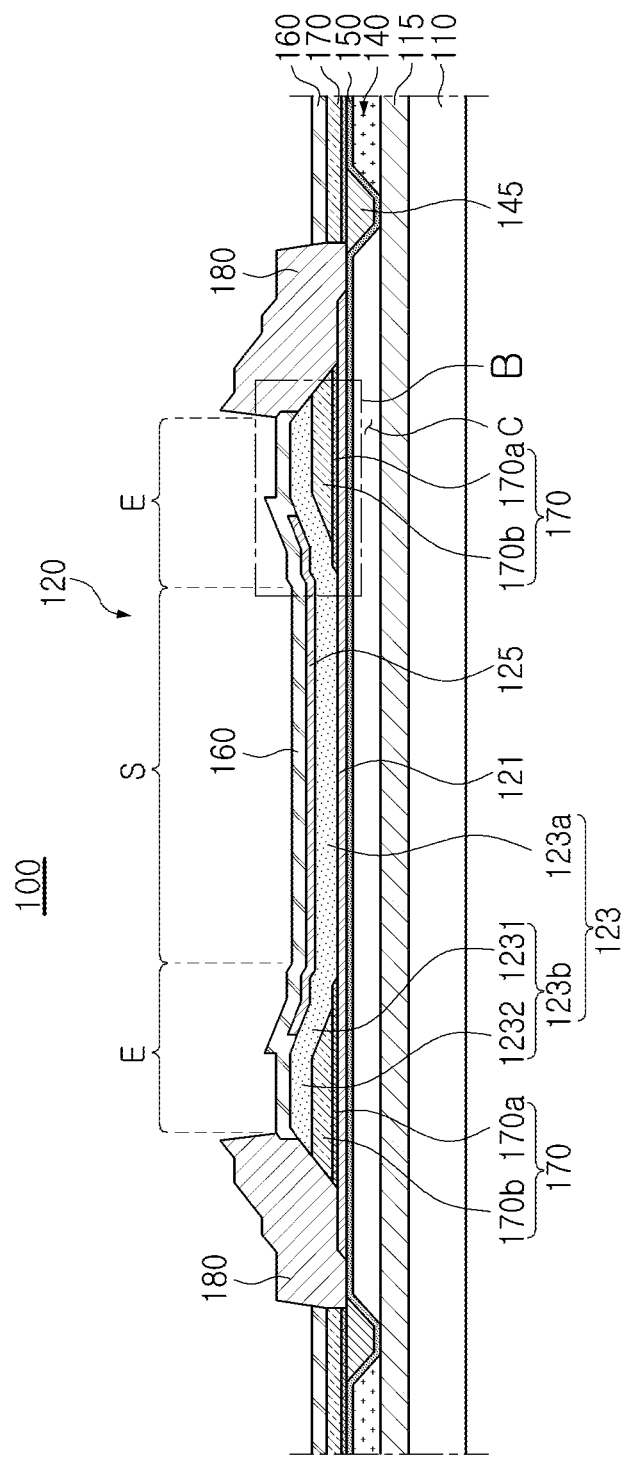
FIG. 4 is a cross-sectional view taken along III-III' of FIG. 1.
Figure 5:
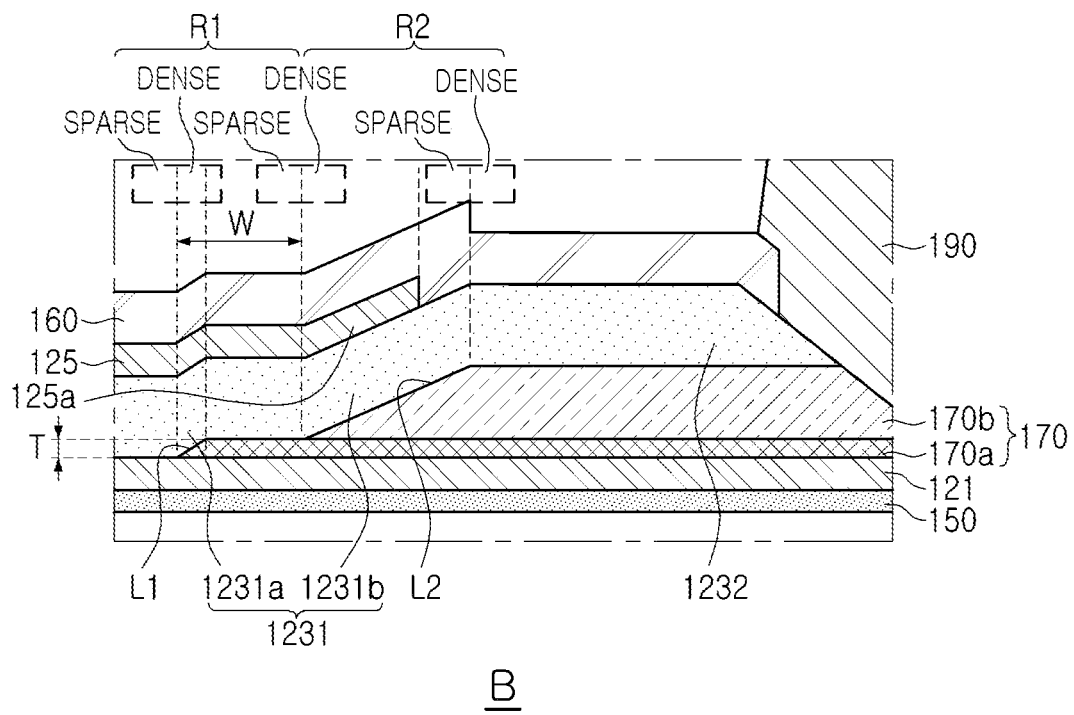
FIG. 5 is an enlarged view of portion B of FIG. 4.
Figure 6:
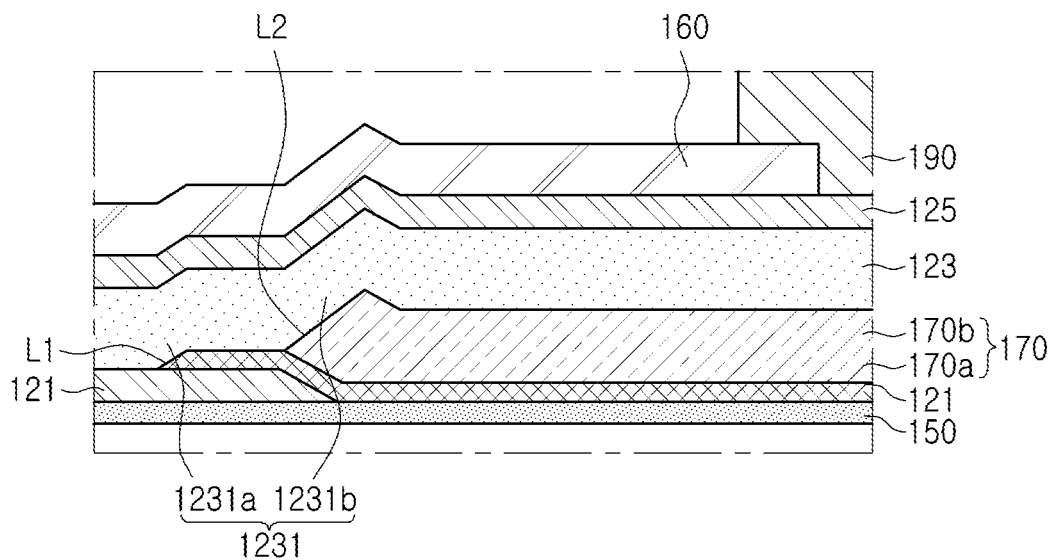
FIG. 6 is an enlarged view of portion A of FIG. 2.

FIG. 1 is a plan view of an acoustic wave resonator according to an example of the present disclosure, FIG. 2 is a cross-sectional view taken along line I-I' of FIG. 1, FIG. 3 is a cross-sectional view taken along line II-II' of FIG. 1, and FIG. 4 is a cross-sectional view taken along line III-III' of FIG. 1. FIG. 5 is an enlarged view of portion B of FIG. 4, and FIG. 6 is an enlarged view of part A of FIG. 2.

Referring to FIGS. 1 to 6, an acoustic wave resonator 100 may be a bulk-acoustic wave (BAW) resonator, and may include a substrate 110, a sacrificial layer 140, a resonator 120, and an insertion layer 170. The insertion layer may include a first insertion layer 170a and a second insertion layer 170b.

The substrate 110 may be a silicon substrate. For example, a silicon wafer may be used as the substrate 110, or a silicon on insulator (SOI) type substrate may be used.

An insulating layer 115 may be provided on an upper surface of the substrate 110 to electrically isolate the substrate 110 and the resonator 120. In addition, the insulating layer 115 prevents the substrate 110 from being etched by etching gas when a cavity C is formed in a manufacturing process of the acoustic-wave resonator.

In this case, the insulating layer 115 may be formed of at least one of silicon dioxide ($SiO_2$), silicon nitride ($Si_3N_4$), aluminum oxide $Al_2O_3$), and aluminum nitride (AlN), and may be formed through any one process of chemical vapor deposition, RF magnetron sputtering, and evaporation.

The sacrificial layer 140 may be formed on the insulating layer 115, and the cavity C and an etch stop portion 145 may be disposed in the sacrificial layer 140.

The cavity C may be formed as an empty space, and may be formed by removing a portion of the sacrificial layer 140.

As the cavity C is formed in the sacrificial layer 140, the resonator 120 formed above the sacrificial layer 140 may be formed to be entirely flat.

The etch stop portion 145 may be disposed along a boundary of the cavity C. The etch stop portion 145 is provided to prevent etching from being performed beyond a cavity region in a process of forming the cavity C.

A membrane layer 150 may be formed on the sacrificial layer 140, and may form an upper surface of the cavity C. Therefore, the membrane layer 150 is also formed of a material that is not easily removed in the process of forming the cavity C.

For example, when a halide-based etching gas such as fluorine (F), chlorine (Cl), or the like is used to remove a portion (e.g., a cavity region) of the sacrificial layer 140, the membrane layer 150 may be made of a material having low reactivity with the etching gas. In this case, the membrane layer 150 may include at least one of silicon dioxide ($SiO_2$) and silicon nitride ($Si_3N_4$).

In addition, the membrane layer 150 may be made of a dielectric layer containing at least one material of magnesium oxide (MgO), zirconium oxide ($ZrO_2$), aluminum nitride (AlN), lead zirconate titanate (PZT), gallium arsenide (GaAs), hafnium oxide ($HfO_2$), and aluminum oxide ($Al_2O_3$), titanium oxide ($TiO_2$), and zinc oxide (ZnO), or a metal layer containing at least one material of aluminum (Al), nickel (Ni), chromium (Cr), platinum (Pt), gallium (Ga), and hafnium (Hf). However, a configuration of the present disclosure is not limited thereto.

The resonator 120 includes a first electrode 121, a piezoelectric layer 123, and a second electrode 125. The resonator 120 is configured such that the first electrode 121, the piezoelectric layer 123, and the second electrode 125 are stacked in order from a bottom. Therefore, the piezoelectric layer 123 in the resonator 120 is disposed between the first electrode 121 and the second electrode 125.

Since the resonator 120 is formed on the membrane layer 150, the membrane layer 150, the first electrode 121, the piezoelectric layer 123, and the second electrode 125 are sequentially stacked on the substrate 110, to form the resonator 120.

The resonator 120 may resonate the piezoelectric layer 123 according to signals applied to the first electrode 121 and the second electrode 125 to generate a resonant frequency and an anti-resonant frequency.

The resonator 120 may be divided into a central portion S in which the first electrode 121, the piezoelectric layer 123, and the second electrode 125 are stacked to be substantially flat, and an extension portion E in which an insertion layer 170 is interposed between the first electrode 121 and the piezoelectric layer 123.

The central portion S is a region disposed in a center of the resonator 120, and the extension portion E is a region disposed along a periphery of the central portion S. Therefore, the extension portion E is a region extended from the central portion S externally, and refers to a region formed to have a continuous annular shape along the periphery of the central portion S. However, if necessary, the extension portion E may be configured to have a discontinuous annular shape, in which some regions are disconnected.

Accordingly, as shown in FIG. 2, in the cross-section of the resonator 120 cut so as to cross the central portion S, the extension portion E is disposed on both ends of the central portion S, respectively. The insertion layer 170 may be disposed on both sides of the central portion S of the extension portion E disposed on both ends of the central portion S.

The insertion layer 170 may have an inclined surface of which a thickness becomes greater as a distance from the central portion S increases.

In the extension portion E, the piezoelectric layer 123 and the second electrode 125 may be disposed on the insertion layer 170. Therefore, the piezoelectric layer 123 and the second electrode 125 located in the extension portion E may have an inclined surface conforming to the shape of the insertion layer 170.

In the present example, it is defined that the extension portion E is included in the resonator 120, and accordingly, resonance may also occur in the extension portion E. However, the configuration is not limited thereto, and resonance may not occur in the extension portion E depending on the structure of the extension portion E, but resonance may occur only in the central portion S.

The first electrode 121 and the second electrode 125 may be formed of a conductor, for example, may be formed of gold, molybdenum, ruthenium, iridium, aluminum, platinum, titanium, tungsten, palladium, tantalum, chromium, nickel, or a metal containing at least one thereof, but is not limited thereto.

In the resonator 120, the first electrode 121 may be formed to have a larger area than the second electrode 125, and a first metal layer 180 may be disposed along a periphery of the first electrode 121 on the first electrode 121. Therefore, the first metal layer 180 may be disposed to be spaced apart from the second electrode 125 by a predetermined distance, and may be disposed in a form surrounding the resonator 120.

Since the first electrode 121 is disposed on the membrane layer 150, the first electrode 121 is formed to be entirely flat. On the other hand, since the second electrode 125 is disposed on the piezoelectric layer 123, curving may be formed corresponding to the shape of the piezoelectric layer 123.

The first electrode 121 may be used as any one of an input electrode and an output electrode for inputting and outputting an electrical signal such as a radio frequency (RF) signal.

The second electrode 125 is entirely disposed in the central portion S, and partially disposed in the extension portion E. Accordingly, the second electrode 125 may be divided into a portion disposed on a piezoelectric portion 123a of the piezoelectric layer 123 to be described later, and a portion disposed on a curved portion 123b of the piezoelectric layer 123.

More specifically, in the present example, the second electrode 125 is disposed to cover an entirety of the piezoelectric portion 123a and a portion of an inclined portion 1231 of the piezoelectric layer 123.

In addition, an end portion (125a in FIG. 5) disposed in the extension portion E is formed to have a smaller area than a second inclined portion 1231b of the inclined portion 1231 described later, and the second electrode 125 is formed to have a smaller area than the piezoelectric layer 123 in the resonator 120.

Accordingly, as shown in FIG. 2, in a cross-section of the resonator 120 cut so as to cross the central portion S, an end of the second electrode 125 is disposed in the extension portion E. In addition, at least a portion of the end of the second electrode 125 disposed in the extension portion E is disposed to overlap the second insertion layer 170b. Here, 'overlap' means that when the second electrode 125 is projected on a plane on which the second insertion layer 170b is disposed, a shape of the second electrode 125 projected on the plane overlaps the second insertion layer 170b.

The second electrode 125 may be used as any one of an input electrode and an output electrode for inputting and outputting an electrical signal such as a radio frequency (RF) signal, or the like. That is, when the first electrode 121 is used as the input electrode, the second electrode 125 may be used as the output electrode, and when the first electrode 121 is used as the output electrode, the second electrode 125 may be used as the input electrode.

The piezoelectric layer 123 is a portion converting electrical energy into mechanical energy in the form of elastic waves through a piezoelectric effect, and is formed on the first electrode 121 and the insertion layer 170 to be described later.

As a material of the piezoelectric layer 123, zinc oxide (ZnO), aluminum nitride (AlN), doped aluminum nitride, lead zirconate titanate, quartz, and the like can be selectively used. In the case of doped aluminum nitride, a rare earth metal, a transition metal, or an alkaline earth metal may be further included. The rare earth metal may include at least one of scandium (Sc), erbium (Er), yttrium (Y), and lanthanum (La). The transition metal may include at least one of hafnium (Hf), titanium (Ti), zirconium (Zr), tantalum (Ta), and niobium (Nb). In addition, the alkaline earth metal may include magnesium (Mg).

In order to improve piezoelectric properties, when the content of elements doped in aluminum nitride (AlN) is less than 0.1 at %, piezoelectric properties higher than that of aluminum nitride (AlN) cannot be realized, and it is difficult to manufacture and control the composition for deposition, so that non-uniform and unwanted crystal phases may be formed.

Accordingly, in the present example, the content of elements doped in aluminum nitride (AlN) may be configured in a range of 0.1 to 30 at %.

In the present example, the piezoelectric layer 123 is doped with scandium (Sc) in aluminum nitride (AlN). In this case, a piezoelectric constant may be increased to increase $Kt^2$ of the acoustic resonator. However, the configuration of the present disclosure is not limited thereto.

The piezoelectric layer 123 includes the piezoelectric portion 123a disposed in the central portion S and the curved portion 123b disposed in the extension portion E.

The piezoelectric portion 123a is a portion directly stacked on the upper surface of the first electrode 121. Therefore, the piezoelectric portion 123a is interposed between the first electrode 121 and the second electrode 125 to be formed to have a flat shape, together with the first electrode 121 and the second electrode 125.

The curved portion 123b may be defined as a region extending from the piezoelectric portion 123a to the outside and positioned in the extension portion E.

The curved portion 123b is disposed on the insertion layer 170, and is formed in a shape in which the upper surface thereof is raised along the shape of the insertion layer 170. Accordingly, the piezoelectric layer 123 is curved at a boundary between the piezoelectric portion 123a and the curved portion 123b, and the curved portion 123b is raised corresponding to the thickness and shape of the insertion layer 170.

The curved portion 123b may be divided into an inclined portion 1231 and an extension portion 1232.

The inclined portion 1231 refers to a portion formed to be inclined along the inclined surface of the insertion layer 170. The extension portion 1232 refers to a portion extending from the inclined portion 1231 to the outside.

The insertion layer 170 includes a first inclined surface L1, which is an inclined surface of the first insertion layer 170a, and a second inclined surface L2, which is an inclined surface of the second insertion layer 170b. Accordingly, the inclined portion 1231 of the piezoelectric layer 123 may include a first inclined portion 1231a formed by the first inclined surface L1 and a second inclined portion 1231b formed by the second surface L2.

Since the first inclined surface L1 and the second inclined surface L2 are disposed to be spaced apart by a predetermined distance, the first inclined portion 1231a and the second inclined portion 1231b may also be disposed to be spaced apart by a predetermined distance. In addition, since the first inclined portion 1231a and the second inclined portion 1231b are formed in parallel with the first inclined surface L1 and the second inclined surface L2 of the insertion layer 170, respectively, the angle of inclination of each of the inclined portions 1231a and 1231b may be formed to be equal to the angle of inclination of the corresponding each of the inclined surfaces L1 and L2.

Further, the insertion layer 170 has a larger second inclined surface L2 than the first inclined surface L1. Therefore, the second inclined portion 1231b, formed on the second inclined surface L2, may be formed to be larger than the first inclined portion 1231a.

The insertion layer 170 may be disposed along a surface formed by the membrane layer 150, the first electrode 121, and the etch stop portion 145. Accordingly, the insertion layer 170 may be partially disposed in the resonator 120, and may be disposed between the first electrode 121 and the piezoelectric layer 123.

The insertion layer 170 may be disposed at a periphery of the central portion S to support a curved portion 123b of the piezoelectric layer 123. Accordingly, the curved portion 123b of the piezoelectric layer 123 may be divided into the inclined portion 1231 and the extension portion 1232 according to the shape of the insertion layer 170.

The insertion layer 170 is disposed in a region except for the central portion S. For example, the insertion layer 170 may be disposed on the substrate 110 in an overall region except for the central portion S, or in some regions.

The insertion layer 170 may include a first insertion layer 170a and a second insertion layer 170b. The second insertion layer 170b may be stacked and disposed on the first insertion layer 170a. Therefore, at least a portion of the first insertion layer 170a may be disposed between the first electrode 121 and the second insertion layer 170b.

Each of the insertion layers 170a and 170b is formed in a shape of which the thickness increases as a side surface, facing the central portion S, is further removed from the central portion S. Accordingly, each of the first and second insertion layers 170a and 170b may have side surfaces disposed on the central portion S may be formed as inclined surfaces L1 and L2.

When the angle of inclination 8 of the inclined surfaces L1 and L2 of the insertion layers 170a and 170b is formed to be narrower than 5°, in order to manufacture it, since the thicknesses of the insertion layers 170a and 170b should be formed to be very thin or an area of the inclined surfaces L1 and L2 should be formed to be excessively large, it is practically difficult to be implemented.

In addition, when the angle of inclination 8 of the side surface of the insertion layer 170 is formed to be wider than 70°, the angle of inclination of the piezoelectric layer 123 or the second electrode 125 stacked on the insertion layer 170 is also formed to be wider than 70°. In this case, since the piezoelectric layer 123 or the second electrode 125 stacked on the inclined surface is excessively curved, cracks may be generated in the curved portion.

Therefore, the angle of inclinations of the inclined surfaces L1 and L2 may be formed in a range of 5° or more and 70° or less.

Meanwhile, as described above, the inclined portion 1231 of the piezoelectric layer 123 may be formed along the inclined surfaces L1 and L2 of the insertion layer 170, and thus, the first inclined portion 1231a and the second inclined portion 1231b disposed on the inclined surfaces L1 and L2 may be formed at the same angle of inclination as the inclined surfaces L1 and L2 of the insertion layer 170. Accordingly, the angle of inclinations of each of the inclined portions 1231a and 1231b may also be formed in a range of 5° or more and 70° or less, similar to the inclined surfaces L1 and L2 of the insertion layer 170. This configuration can also be applied equally to the second electrode 125 stacked on the second inclined portion 1231b of the piezoelectric layer 123.

The first insertion layer 170a may be disposed to protrude further toward the central portion S than the second insertion layer 170b. Accordingly, the inclined surface L1 of the first insertion layer 170a and the inclined surface L2 of the second insertion layer 170b may be disposed to be spaced apart by a predetermined distance in a horizontal direction (e.g., a surface direction of the first electrode).

This configuration is for improving the reflective characteristics of lateral waves by expanding the reflective characteristics of lateral waves.

As shown in FIG. 5, the bulk-acoustic wave resonator of the present example includes a first reflective structure R1 formed through an inclined surface L1 of the first insertion layer 170a, and a second reflective structure R2 formed through an inclined surface L2 of the second insertion layer 170b.

Here, the reflective structure may be formed by forming a difference in acoustic impedance at a boundary of the reflective interface.

Acoustic impedance is an inherent property of a material and is expressed as a product of the density of the material in a bulk state (kg/m3) and a speed of sound waves in the material (m/s).

As the bulk-acoustic wave resonator of this example includes a first reflective structure R1 and a second reflective structure R2, and as shown in FIG. 5, since a sparse/dense structure is repeatedly formed in pairs from the central portion, reflective characteristics can be improved.

Accordingly, the lateral wave generated from the resonator 120 is mostly reflected toward the central portion S through a double reflective structure including the first reflective structure R1 and the second reflective structure R2, an energy loss due to lateral waves may be minimized, and thus, the performance of the bulk-acoustic wave resonator may be improved.

The first and second insertion layers 170a and 170b may be formed a dielectric such as silicon oxide ($SiO_2$), aluminum nitride (AlN), aluminum oxide ($Al_2O_3$), silicon nitride ($Si_3N_4$), magnesium oxide (MgO), and zirconium oxide ($ZrO_2$), lead zirconate titanate (PZT), gallium arsenide (GaAs), hafnium oxide ($HfO_2$), titanium oxide ($TiO_2$), zinc oxide (ZnO), or the like, respectively, and may be formed of a material different from the piezoelectric layer 123.

In addition, in this example, the first insertion layer 170a and the second insertion layer 170b may be formed of different materials. For example, the first insertion layer 170a and the second insertion layer 170b may be formed of materials having different etching rates. In this case, in the process of forming the second insertion layer 170b, an etch selectivity with the first insertion layer 170a may be improved.

In addition, in the present example, the first insertion layer 170a may be formed of a material having a greater acoustic impedance than the second insertion layer 170b. For example, in the present embodiment, when the first insertion layer 170a is formed of silicon oxide ($SiO_2$), the second insertion layer 170b may be formed of any one of alumina ($Al_2O_3$), aluminum nitride (AlN), silicon carbide (SiC), and silicon nitride ($Si_3N_4$).

In this case, since deformation or loss of the first insertion layer 170a can be minimized in the process of forming (etching, or the like) the second insertion layer 170b, reflective characteristics of lateral waves can be improved.

In addition, the first insertion layer 170a and the second insertion layer 170b may have different thicknesses. Specifically, the second insertion layer 170b may be formed thicker than the first insertion layer 170a.

As shown in FIG. 2, and the like, the second electrode 125 is disposed above the second inclined surface L2 whose end is an inclined surface of the second insertion layer 170b. Therefore, when the second insertion layer 170b is excessively thin, an area of the second inclined surface L2 is reduced, so it is difficult to place the end of the second electrode 125 above the second inclined surface L2.

On the other hand, in the case of the first insertion layer 170a, since the overall thickness of the insertion layer 170 increases as the thickness increases, the thickness of the resonator itself may increase. Therefore, in this example, the first insertion layer 170a is formed to be thinner than that of the second insertion layer 170b.

As a result of testing the resonator 120 while varying the thickness of the second insertion layer 170b, when the thickness of the second insertion layer 170b is less than 2000 Å, an area of the second inclined surface L2 is narrow and it is difficult to place the end of the second electrode above the second inclined surface L2.

In this case, when the thickness of the first insertion layer 170a exceeds 2000 Å, the thickness of the entirety of the insertion layer 170 exceeds 4000 Å (when the second insertion layer is 2000 Å or more), so a thickness range of the second insertion layer 170b can be very limited.

Accordingly, in this example, the first insertion layer 170a may be formed to have a thickness of 2000 Å or less, and the second insertion layer 170b may be formed to have a thickness of 2000 Å or more. In addition, the second inclined surface L2 may be formed to have a larger area than the first inclined surface L1.

Meanwhile, as described above, since the second inclined portion 1231b and an end 125a of the second electrode are disposed above the second inclined surface L2, when an angle of inclination of the second inclined surface L2 exceeds 40°, since the area of the second inclined surface L2 is narrow, it is difficult to place the end 125a of the second electrode 125 above the second inclined surface L2 in a manufacturing process.

In addition, when the thickness of the second insertion layer 170b exceeds 1 μm, it is difficult to elaborately form the second inclined surface L2 in an etching process of forming the second inclined surface L2. Specifically, when the thickness of the second insertion layer 170b exceeds 1 μm, the second inclined surface L2 is not formed as one flat inclined surface due to the excessive thickness of the second insertion layer 170b and formed with an inclined surface having multiple angle of inclinations.

In this case, it is difficult to implement a desired reflective structure through the second inclined surface L2 of the second insertion layer 170b. Accordingly, in the bulk-acoustic wave resonator of this example, the thickness of the second insertion layer 170b may be 1 μm or less.

Accordingly, in the present example, the second inclined surface L2 may have an angle of inclination of 5° or more and 40° or less.

In addition, in the case of the first inclined surface L1, the larger the area, the smaller a resonance active region, or a total area of the bulk-acoustic wave resonator must be increased, so the smaller the area of the first inclined surface L1 is, the more advantageous.

In addition, in order to form the angle of inclination of the first inclined surface L1 of the first insertion layer 170a having a thin thickness (e.g., 2000 Å or less) to be less than 30°, an etching rate must be performed at a very slow etching rate.

In this case, due to the slow etching rate, the distribution of the overall shape of the first insertion layer 170a may increase, and thus a degree of precision of an entire structure of the bulk-acoustic wave resonator may be lowered. Accordingly, in this example, the first inclined surface L1 may be formed in a range of 30° or more and 70° or less.

In this example, the angle of inclination of the second inclined surface L2 and the angle of inclination of the first inclined surface L1 may be formed at different angles. In addition, the second inclined surface L2 must secure a certain area so that the end 125a of the second electrode 125 can be easily disposed thereabove.

Therefore, when the angle of inclination of the first inclined surface L1 is smaller than the angle of inclination of the second inclined surface L2, since the area of the first inclined surface L1 increases, and the area of the overall inclined surface may be excessively increased. In this case, the resonant active region must be reduced or the total area of the bulk-acoustic wave resonator must be increased. Accordingly, in this example, the angle of inclination of the second inclined surface L2 may be formed to be narrower than the angle of inclination of the first inclined surface L1.

In addition, as described above, this example includes a first reflective structure R1 formed through the inclined surface L1 of the first insertion layer 170a and a second reflective structure R2 formed through the second insertion layer L2 of the second insertion layer 170b.

Since the lateral wave propagates from the center portion S toward the extension portion E, it is advantageous to reflect the lateral waves as much as possible through the first reflective structure R1 where the lateral waves meet first. In addition, the higher the angle of inclination of the inclined surface where the lateral waves meet, the higher the reflection efficiency.

To this end, the angle of inclination of the first inclined surface L1 is wider than the angle of inclination of the second inclined surface L2. Accordingly, a significant portion of the lateral waves may be reflected toward the central portion S in the first reflective structure R1. In addition, the remaining lateral waves that are not reflected from the first reflective structure R1 may be reflected from the second reflective structure R2 by the second inclined surface L2.

Meanwhile, when the angle of inclination of the first inclined surface L1 is narrower than the angle of inclination of the second inclined surface L2, since the first inclined surface L1 is formed with an angle of inclination of 40° or less, a significant portion of the lateral waves may pass through the first reflective structure R1. Since the second inclined surface L2 is also formed with an angle of inclination of 40° or less, there is a limit in reflecting all the lateral waves that have passed through the first reflective structure R1 from the second reflective structure R2.

As described above, in the insertion layer 170 of the present example, more effective reflection can be achieved when the angle of inclination of the first inclined surface L1 is wider than that of the second inclined surface L2. Accordingly, the angle of inclination of the first inclined surface L1 may be formed to be wider than that of the second inclined surface L2.

Figures 7, 8:
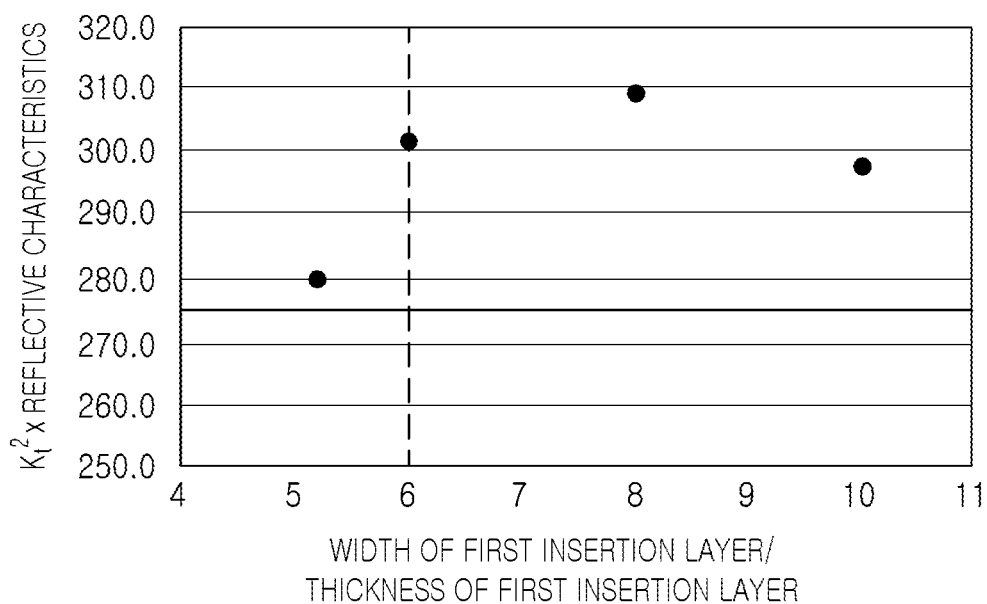
FIG. 7 is a diagram illustrating the performance of a bulk-acoustic wave resonator measured according to the thickness of the first insertion layer and the width of the first insertion layer.
FIG. 8 is a diagram illustrating the data of FIG. 7 as a graph.

FIG. 7 is a view illustrating the performance of a bulk-acoustic wave resonator according to the thickness of the first insertion layer and the width of the first insertion layer, and FIG. 8 is a view showing the data of FIG. 7 in a graph. Here, as shown in FIG. 5, the width W of the first insertion layer 170a is a horizontal distance between an end of the first insertion layer 170a and an end of the second insertion layer 170b, and refers to a width of a region protruding outwardly of the second insertion layer 170b.

In addition, the reflective characteristics in FIG. 7 refer to a characteristic collecting that vertical waves generated in the vertical direction from the bulk-acoustic wave resonator are diffused in the horizontal direction toward the central portion, and for example, refers to a degree of sharpness of the anti-resonant frequency graph in the impedance waveform graph of the bulk-acoustic wave resonator.

Therefore, the reflective characteristics are large, meaning that the loss occurring as the lateral wave escapes to the outside of the resonator 120 is small, and consequently, meaning that the performance of the acoustic resonator is improved.

Referring to FIG. 7, in the case of a bulk-acoustic wave resonator (Comparative Examples 1, 2, and 3) including a first insertion layer 170a and a second insertion layer 170b, it can be seen that $k_t^2$ is lowered, but reflective characteristics are greatly improved, compared to the bulk-acoustic wave resonator (Comparative Example 1) including only one insertion layer.

Thereby, it can be seen that the performance of the bulk-acoustic wave resonator is improved as both the $k_t^2$ and reflective characteristics are large, but are factors that are in inverse proportion to each other.

Therefore, it is necessary to manufacture a bulk-acoustic wave resonator so that both $k_t^2$ and reflective characteristics are included in an appropriate range. To this end, in this bulk-acoustic wave resonator example, the performance of the bulk-acoustic wave resonator is classified based on a parameter obtained by multiplying $k_t^2$ and the reflective characteristics.

Referring to FIG. 7, when a ratio (W/T) of the width (W) of the first insertion layer 170a to the thickness (T) of the first insertion layer 170a is 6 or more, a parameter multiplied by the $k_t^2$ and the reflective characteristics increase significantly and appeared close to 300. Accordingly, the bulk-acoustic wave resonator of the present example may satisfy Equation 1 below with respect to the first insertion layer 170a.

Width of first insertion layer (W)/Thickness of first insertion layer (T)>6    Equation 1

Meanwhile, as described above, the first insertion layer 170a may be formed to a thickness of 2000 Å or less. Therefore, if Equation 1 is applied, in this case, the width of the first insertion layer can be formed to be 1.2 µm or more.

Meanwhile, referring to FIG. 7, it can be seen that $k_t^2$ decreases as the width W of the first insertion layer increases. From the trend of the data shown in FIG. 7, when the width W of the first insertion layer exceeds 3 µm, $k_t^2$ may be excessively reduced, so that the performance of the volume acoustic resonator may be rather degraded.

Therefore, in the bulk-acoustic wave resonator of the present example, the width W of the first insertion layer may be 3 µm or less, and in this case, since the thickness of the first insertion layer may be 2000 Å or less as described above, a ratio (W/T) of the width (W) of the first insertion layer to the thickness (T) of the first insertion layer described above may be 15 or less.

The resonator 120 configured as described above is disposed to be spaced apart from the substrate 110 through the cavity C disposed below a membrane layer 150. Accordingly, the membrane layer 150 is disposed below the first electrode 121 and the insertion layer 170 to support the resonator 120.

The cavity C is formed as an empty space, and may be formed by removing a portion of the sacrificial layer 140 by supplying etching gas (or an etching solution) to an inlet hole (H in FIG. 1) during the manufacturing process of the acoustic resonator.

A protective layer 160 is disposed along the surface of the acoustic resonator 100 to protect the acoustic resonator 100 from the outside. The protective layer 160 may be disposed along a surface formed by the second electrode 125 and the curved portion 123b of the piezoelectric layer 123.

The protective layer 160 may be made of a dielectric layer containing any one material of silicon nitride ($Si_3N_4$), silicon oxide ($SiO_2$), magnesium oxide (MgO), zirconium oxide ($ZrO_2$), aluminum nitride (AlN), lead lithium titanate (PZT), gallium arsenide (GaAs), hafnium oxide ($HfO_2$), aluminum oxide ($Al_2O_3$), titanium oxide ($TiO_2$), and zinc oxide (ZnO), but is not limited thereto.

The protective layer 160 may be formed as a single layer, but it may be formed by stacking two layers of different materials if necessary. In addition, the protective layer 160 may be partially removed for frequency control in a final process. For example, the thickness of the protective layer 160 may be adjusted in a frequency trimming process.

Meanwhile, the first electrode 121 and the second electrode 125 may extend to the outside of the resonator 120. In addition, a first metal layer 180 and a second metal layer 190 may be disposed on the upper surface of the extended portion, respectively.

The first metal layer 180 and the second metal layer 190 may be made of any material among gold (Au), a gold-tin (Au—Sn) alloy, copper (Cu), a copper-tin (Cu—Sn) alloy, and aluminum (Al), or an aluminum alloy. Here, the aluminum alloy may be an aluminum-germanium (Al—Ge) alloy or an aluminum-scandium (Al—Sc) alloy.

The first metal layer 180 and the second metal layer 190 may function as a connection wiring electrically connecting the electrodes 121 and 125 of the acoustic resonator 120 on the substrate 110 and the electrodes of other acoustic resonators disposed adjacent to each other, or a terminal for external connections. However, the configuration is not limited thereto.

The first metal layer 180 may penetrate through the protective layer 160 and be bonded to the first electrode 121.

In addition, in the resonator 120, the first electrode 121 is formed to have a larger area than the second electrode 125, and as shown in FIG. 1, a first metal layer 180 may also be disposed on a circumferential portion of the first electrode 121.

Accordingly, the first metal layer 180 may be disposed along the periphery of the resonator 120 and may be disposed to partially surround the second electrode 125. However, the configuration is not limited thereto.

The bulk-acoustic wave resonator 100 includes a first insertion layer 170a and a second insertion layer 170b formed with inclined surfaces L1 and L2 on the side surfaces disposed toward the center. In addition, the inclined surface L1 of the first insertion layer 170a and the inclined surface L2 of the second insertion layer 170b are disposed to be spaced apart by a predetermined distance.

Accordingly, since the bulk-acoustic wave resonator 100 is provided with a first reflective structure R1 by a first inclined surface L1 and a second reflective structure R2 by a second inclined surface L2, compared to a case in which only one insertion layer is provided, a reflective interface reflecting lateral waves toward the center of the resonator is increased.

Accordingly, energy leakage in the resonator 120 to the outside of the resonator 120 can be suppressed as much as possible, thereby improving the performance of the bulk-acoustic wave resonator.

Meanwhile, the configuration is not limited to the above-described examples, and various modifications are possible.

Figure 9:
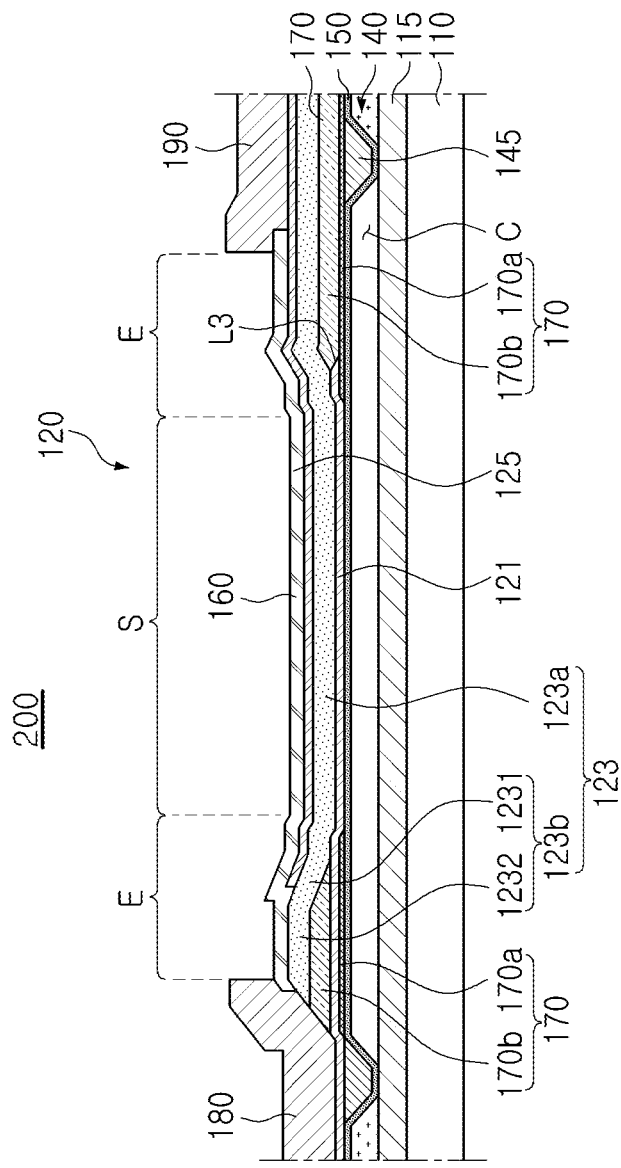
FIG. 9 is a cross-sectional view of a bulk-acoustic wave resonator according to an example.

FIG. 9 is a cross-sectional view schematically illustrating a bulk-acoustic wave resonator according to another example of the present disclosure.

Referring to FIG. 9, a bulk-acoustic wave resonator 200 is configured similar to the bulk-acoustic wave resonator shown in FIG. 1, and differs only in that a first insertion layer 170a is disposed below a first electrode 121. Therefore, detailed descriptions of the same configurations as those of the above-described examples are omitted, and different configurations will be described in detail.

As shown in FIG. 9, in a cross-section of the resonator 120 cut to across the central portion S, the insertion layer 170 is disposed on the extension portion E located on both sides of the central portion S, respectively. In addition, the first insertion layer 170a is stacked on the membrane layer 150 and the first electrode 121 is disposed on the first insertion layer 170a.

For this reason, the first insertion layer 170a is disposed below the first electrode 121, and at least a portion of the second insertion layer 170b is disposed above the first electrode 121, and at least a portion of the first electrode 121 is disposed between the first insertion layer 170a and the second insertion layer 170b.

In addition, the insertion layer 170 on a right side, in contact with the end of the first electrode 121 of the second insertion layer 170b is configured to not to cover the upper surface of the first electrode 121 and contact only a third surface L3, which is an inclined surface of the end of the first electrode 121.

The bulk-acoustic wave resonator 200 of this example may be formed by first forming a first insertion layer 170a on the membrane layer 150, and sequentially forming a first electrode 121 and a second insertion layer 170b on the first insertion layer 170a. As described above, the first insertion layer 170a and the second insertion layer 170b may be modified in various forms.

Figure 10:
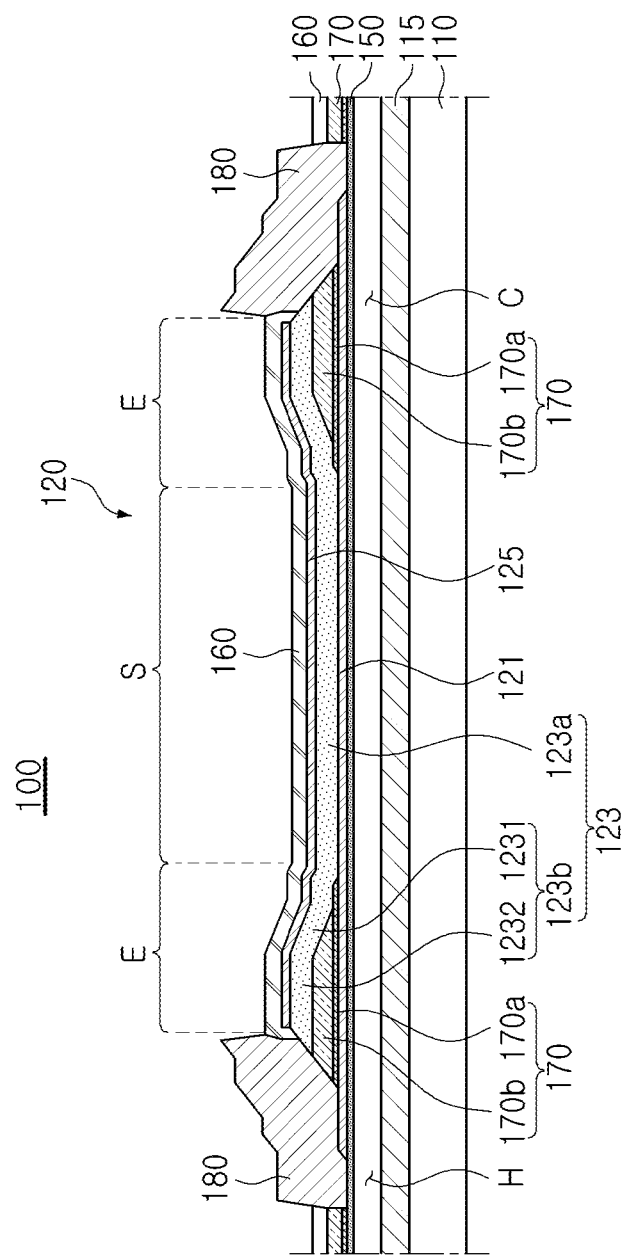
FIG. 10 is a cross-sectional view of a bulk-acoustic wave resonator according to an example.

FIG. 10 is a cross-sectional view schematically illustrating a bulk-acoustic wave resonator according to another example of the present disclosure. In the bulk-acoustic wave resonator illustrated in the present example, a second electrode 125 is disposed on an upper surface of the piezoelectric layer 123, and accordingly, the second electrode 125 is formed not only on the inclined portion 1231 but also on the extension portion 1232 of the piezoelectric layer 123.

As set forth above, according to the bulk-acoustic wave resonator according to the various examples, since the bulk-acoustic wave resonator provides an additional reflective interface through two insertion layers, it is possible to minimize leakage of energy in the resonator to the outside of the resonator as much as possible, thereby improving the performance of the bulk-acoustic wave resonator.

While this disclosure includes specific examples, it will be apparent after an understanding of the disclosure of this application that various changes in forms and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A bulk-acoustic wave resonator, comprising:
a resonator including a central portion in which a first electrode, a piezoelectric layer, and a second electrode are sequentially stacked on a substrate, and an extension portion disposed along a periphery of the central portion; and
an insertion layer disposed between the piezoelectric layer and the substrate in the extension portion,
wherein the insertion layer comprises a first insertion layer having a first inclined surface formed along a side surface facing the central portion and a second insertion layer disposed between the first insertion layer and the piezoelectric layer and having a second inclined surface spaced apart from the first inclined surface with respect to a surface direction of the first electrode, and
wherein the first insertion layer is thinner than the second insertion layer.

2. The bulk-acoustic wave resonator of claim 1, wherein a ratio of a width of the first insertion layer to a thickness of the first insertion layer is greater than or equal to 6, where the width of the first insertion layer is a distance between a terminal end of the first inclined surface of the first insertion layer and a terminal end of the second inclined surface of the second insertion layer.

3. The bulk-acoustic wave resonator of claim 1, wherein the first inclined surface and the second inclined surface have different angles of inclination.

4. The bulk-acoustic wave resonator of claim 3, wherein an angle of inclination of the second inclined surface is narrower than an angle of inclination of the first inclined surface.

5. The bulk-acoustic wave resonator of claim 3, wherein an angle of inclination of the first inclined surface is within a range of 30° or higher to 70° or lower, and an angle of inclination of the second inclined surface is within a range of 5° or higher to 70° or lower.

6. The bulk-acoustic wave resonator of claim 4, wherein the second insertion layer has a thickness of 2000 Å or more, and the first insertion layer has a thickness of 2000 Å or less.

7. The bulk-acoustic wave resonator of claim 1, wherein the first insertion layer is formed of a material having a larger acoustic impedance than an acoustic impedance of the second insertion layer.

8. The bulk-acoustic wave resonator of claim 7, wherein the first insertion layer is formed of silicon oxide ($SiO_2$).

9. The bulk-acoustic wave resonator of claim 8, wherein the second insertion layer is formed of any one of alumina ($Al_2O_3$), aluminum nitride (AlN), silicon carbide (SiC), and silicon nitride ($Si_3N_4$).

10. The bulk-acoustic wave resonator of claim 1, wherein the piezoelectric layer comprises a first inclined portion defined by the first inclined surface and a second inclined portion defined by the second inclined surface, and
the first inclined portion and the second inclined portion are spaced apart with respect to the surface direction of the first electrode.

11. The bulk-acoustic wave resonator of claim 10, wherein an end of the second electrode is disposed on the second inclined portion.

12. The bulk-acoustic wave resonator of claim 1, wherein the first insertion layer is disposed between the first electrode and the substrate, and
at least a portion of the second insertion layer is disposed between the first electrode and the piezoelectric layer.

13. A bulk-acoustic wave resonator, comprising:
a resonator including a central portion in which a first electrode, a piezoelectric layer, and a second electrode are sequentially stacked on a substrate, and an extension portion disposed along a periphery of the central portion; and
an insertion layer disposed between the piezoelectric layer and the substrate in the extension portion,
wherein the insertion layer comprises a first insertion layer having a first inclined surface formed along a side surface facing the central portion and a second insertion layer disposed between the first insertion layer and the piezoelectric layer and having a second inclined surface spaced apart from the first inclined surface with respect to a surface direction of the first electrode,
wherein an angle of inclination of the second inclined surface is narrower than an angle of inclination of the first inclined surface.

14. The bulk-acoustic wave resonator of claim 13, wherein the angle of inclination of the first inclined surface is within a range of 30° or higher to 70° or lower, and the angle of inclination of the second inclined surface is within a range of 5° or higher to 40° or lower.

15. The bulk-acoustic wave resonator of claim 14, wherein the second inclined surface has a wider area than the first inclined surface.

16. The bulk-acoustic wave resonator of claim 13, wherein the first insertion layer and second insertion layer have different thicknesses.

* * * * *